(12) United States Patent
Zapf et al.

(10) Patent No.: US 7,701,201 B2
(45) Date of Patent: Apr. 20, 2010

(54) INDUCTIVE SWITCH

(75) Inventors: Martin Zapf, Creussen (DE); Thomas Luber, Hahnbach (DE); Reinhard Pirner, Koenigstein (DE)

(73) Assignee: Cherry GmbH, Auerbach (DE)

( * ) Notice: Subject to any disclaimer, the term of this patent is extended or adjusted under 35 U.S.C. 154(b) by 815 days.

(21) Appl. No.: 10/571,947

(22) PCT Filed: Sep. 10, 2004

(86) PCT No.: PCT/EP2004/010136

§ 371 (c)(1),
(2), (4) Date: Mar. 13, 2006

(87) PCT Pub. No.: WO2005/027347

PCT Pub. Date: Mar. 24, 2005

(65) Prior Publication Data

US 2008/0142346 A1    Jun. 19, 2008

(30) Foreign Application Priority Data

Sep. 11, 2003  (WO) .................... PCT/EP03/10126

(51) Int. Cl.
 *G01B 7/14* (2006.01)
(52) U.S. Cl. .................... 324/207.17; 324/207.24
(58) Field of Classification Search ............ 324/207.17, 324/207.24
See application file for complete search history.

(56) References Cited

U.S. PATENT DOCUMENTS

| | | | |
|---|---|---|---|
| 3,781,749 A | 12/1973 | Iles et al. | |
| 3,875,555 A | 4/1975 | Potter | |
| 4,580,478 A | 4/1986 | Brosh et al. | |
| 4,642,595 A | 2/1987 | Ruumpol | |
| 4,658,153 A | 4/1987 | Brosh et al. | |
| 4,843,259 A | 6/1989 | Weisshaupt | |
| 5,003,260 A | 3/1991 | Auchterlonie | |
| 5,079,523 A | 1/1992 | Kleinhans | |

(Continued)

FOREIGN PATENT DOCUMENTS

DE    2653371    9/1978

(Continued)

OTHER PUBLICATIONS

Apr. 30, 1999 Radiation-proof proximity sensor, B.V. Jayawant et al., Measurement+ Control 32 80-83.

*Primary Examiner*—Reena Aurora
(74) *Attorney, Agent, or Firm*—Jordan and Hamburg LLP

(57) ABSTRACT

The invention relates to an inductive sensor unit having one or several coils, which are mounted on a printed circuit board in a planar manner. According to the invention, a change in the inductance of a sensor coil due to leakage currents in the inductive actuator is correlated with the position of the actuator in two respects i.e., with the distance x to the sensor coils and with the overlapping y of the sensor coils. As a result, an inductive push button switch and an inductive position switching device (a sliding switch) are provided. The invention also relates to the evaluation of the inductance by means of reactance measurement. A relative evaluation of the influence of adjacent sensor coils increases the precision of response in push button switches and, generally, a relative evaluation of the influence of adjacent sensor coils is carried out in position switching devices.

16 Claims, 10 Drawing Sheets

U.S. PATENT DOCUMENTS

| | | | |
|---|---|---|---|
| 5,233,294 | A | 8/1993 | Dreoni |
| 5,264,809 | A | 11/1993 | Tamino |
| 5,388,476 | A | 2/1995 | Harger et al. |
| 5,425,073 | A | 6/1995 | Bitzer et al. |
| 5,617,023 | A | 4/1997 | Skalski |
| 6,043,644 | A | 3/2000 | De Coulon et al. |
| 6,179,938 | B1 | 1/2001 | Guenther et al. |
| 6,175,232 | B1 | 6/2001 | De Coulon et al. |
| 6,822,440 | B2 | 11/2004 | Machul |
| 6,852,937 | B2 | 2/2005 | Zapf et al. |
| 6,853,183 | B2 | 2/2005 | Kindler |
| 2005/0258687 | A1 | 11/2005 | Zapf et al. |
| 2008/0157756 | A1 | 7/2008 | Eissner et al. |

FOREIGN PATENT DOCUMENTS

| | | |
|---|---|---|
| DE | 3619238 | 3/1987 |
| DE | 3735694 | 5/1988 |
| DE | 3743259 | 6/1989 |
| DE | 40 38 515 | 6/1992 |
| DE | 19806529 | 8/1999 |
| DE | 10125278 | 12/2002 |
| DE | 102 42 385 | 4/2004 |
| EP | 0 455 613 | 11/1991 |
| EP | 0 537 747 | 4/1993 |
| EP | 0 936 385 | 8/1999 |
| FR | 28 03030 | 6/2001 |
| GB | 1415644 | 11/1975 |
| WO | WO 2004/027994 | 4/2004 |

INDUCTIVE SWITCH

BACKGROUND OF THE INVENTION

The invention relates to an inductive switch apparatus having a sensor unit and can be used in particular for a position switch apparatus that is used in automatic motor vehicle transmissions.

Known in the prior art is a displacement and angle sensor, in particular for determining a gear that has been selected in the motor vehicle field, in accordance with patent DE 198 06 529. The known displacement and angle sensor has four measurement coils that are arranged at right angles to one another on a coil carrier in an X/Y plane and are connected to evaluation electronics. The sensor has a so-called target that can be moved largely parallel to the X/Y plane relative to the measurement coils, thereby inducing voltages in the measurement coils. The evaluation electronics can determine the path traveled in the Y direction and the angle $\alpha$ of the target in a Z/X plane from the induced voltages. The known displacement and angle sensor is distinguished in that the opposing measurement coils are arranged spaced from one another and the adjacent measurement coils at least partially overlap one another.

The older application DE 102 42 385 A1 discloses an inductive sensor unit having at least two sensor coils that are mounted on a printed circuit board adjacent to one another in a planar manner. By an adjacent conductive actuating element the distance x to the sensor coils and the overlap y of the sensor coils can be changed. The evaluation of the changes in inductance that thus arise occurs, as for inductive proximity switches, by including the sensor coils in an oscillating circuit. Such an evaluation of resonance is sensitive to temperature and relatively complex.

Furthermore known in the field of automobiles is widespread employment of mechanical switches, including lock systems, operating elements for the dashboard, seat adjustments, mirror adjustments, etc. Mechanical switches have the disadvantage that they do not work in a wear-free manner. Their service life is limited by the material wear of the contact material, changes in the material (oxidation), and deposits on the switch contacts due to mechanical friction or electrical overloading or due to arcing when turning off.

One particular form of mechanical switches are mechanical sliding switches. A displaceable contact runs over a slide track and thus, depending on the position, produces a contact to various connections (so-called encoding switches). In such a shift gate unit, vibrations that occur in the vehicle lead to increased wear in the sliding contacts and slide tracks.

In modern vehicles, actuating motors these days are generally switched via wear-free power semiconductors, which then however are controlled by non-wear-free switches. In order to design the system completely wear-free, it is necessary to develop novel switches that work without mechanical switch contacts (that is, with sensors).

Known from the prior art are Hall sensors that react to the approach of permanent magnets and thus trigger a switching function. Furthermore known is the use of GMR sensors, which are based on the effect of a change in resistance that is caused by an external magnetic field. The external magnetic field can derive from a permanent magnet or a magnetizable plastic and can initiate appropriate switching functions.

Furthermore known is the use of light barriers and reflex light barriers, which have the disadvantage that they are sensitive to stray light and that the optical components age and can be soiled easily. The use of such sensors furthermore has the disadvantage that they are expensive compared to mechanical switches and inductive switches.

In switching elements, cost-effective printed circuit boards are frequently used as carriers for illumination, displays, or mechanical switches. The presence of such a printed circuit board favors the use of the present invention. The working principle of the inductive coupling of two sensor coils applied to the printed circuit board and their damping by a conductive actuator was disclosed as a cost-effective option for instance in DE 101 25 278. In it, damping strength correlates to the position of the actuator relative to the sensors. In this technology, it can be disadvantageous that the sensors in their practical design must have a minimum size of approx. 10 mm×10 mm on the printed circuit board so that acceptable coupling can be achieved and thus the electronics can be designed simply and cost-effectively. In the printed circuit boards that can currently be economically produced, a local resolution of 0.12 mm is attained, i.e., the conductor width of the sensor windings can be a maximum of 0.12 mm, just like the insulating width between the windings. As a result of this, the transmitter coil and the receiver coil of the sensors can have only approx. 5 windings.

The object of the invention is to influence the inductance of sensor coils using an actuator brought over the coil and to evaluate this change in inductance in a simple manner.

SUMMARY OF THE INVENTION

The inductance of a coil chances significantly through a conductive actuator element that has a variable distance x to the sensor coils and/or a variable overlap y of the sensor coils. This object is attained by an inductive switching apparatus in accordance with the invention.

An undamped sensor coil with the external dimensions 10 mm×10 mm, which is wound on the printed circuit board like a rectangular spiral from the inside to the outside, has 10 windings and an inductance of approx. 1 µH at the resolution that can be attained on the printed circuit board.

Although using the impedance of a spiral structure as a sensor is known from publication GB 1 415 644, the known spiral structure is double-wound in order to exploit the ohmic components of the spiral impedance and in order to switch off the inductive components of the spiral impedance. In contrast thereto, the sensor coil in accordance with the invention is single-wound, as can be seen from the following detailed description using the figures.

DETAILED DESCRIPTION OF THE INVENTION

Figure 1:
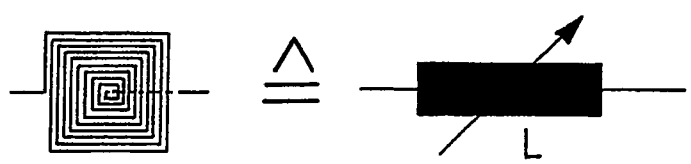
FIG. 1 illustrates the planar design of a sensor slide on a printed circuit board together with the electrotechnically equivalent symbol L.

In accordance with FIG. 1, a sensor coil is applied in a planar manner to a printed circuit board. The connection in the center point of the spiral is executed for instance on the back side of the printed circuit board. If the sensor is covered in accordance with FIG. 1 with a conductive actuator at a distance x of for instance x=0.05 mm, the inductance decreases from for instance approx. 1 μH to for instance approx. 0.2 μH.

Figure 2:
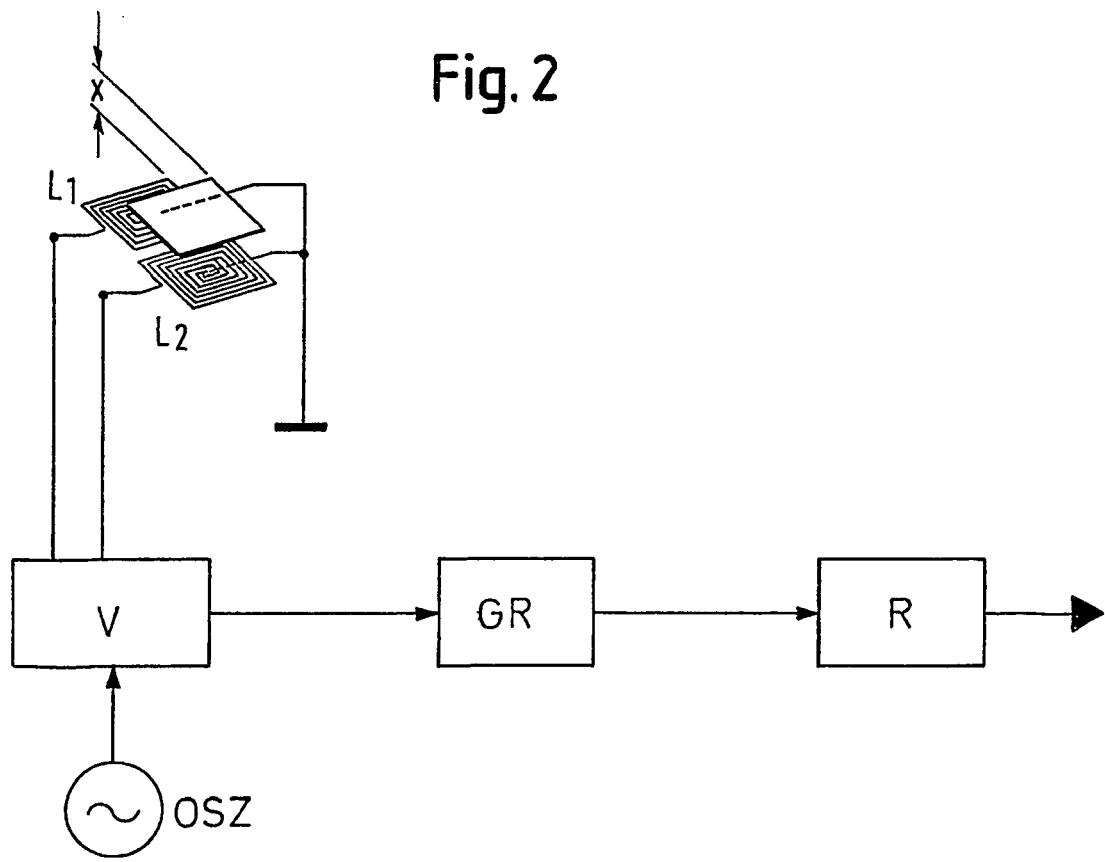
FIG. 2 illustrates a functional circuit diagram of an inventive switching apparatus with sensor unit with a reactance measurement as evaluation circuit.
Figure 3:
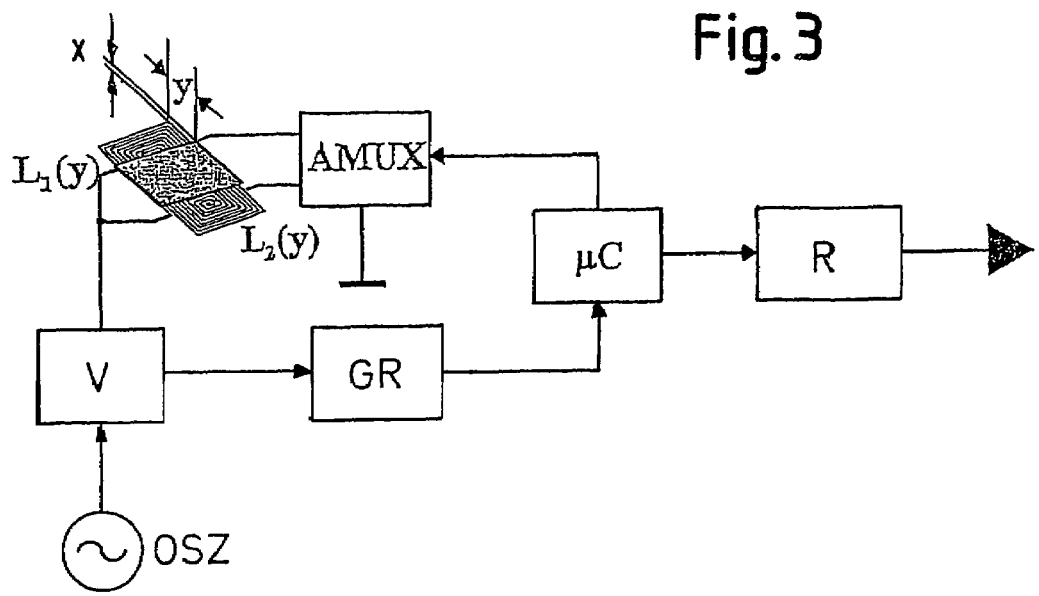
FIG. 3 illustrates a function circuit diagram with a reactance evaluation and with two sensors controlled using multiplex for detecting a displacement path y.

The decrease in the induction using the actuator B is a function of the distance x from the actuator B to the sensor slide (FIG. 2); however, it is also a function of the degree to which the sensor slide is covered by the actuator element (FIG. 3). If the actuator covers the entire surface of a slide in accordance with FIG. 1 at a constant distance x, the amplitude of the sensor voltage is minimal with the degree of coverage of 100%, whereby the amount of the minimum sensor voltage depends on the distance x. The reactance L is thus variable (FIG. 1).

Thus two switching mechanisms are possible for the switch:
  The degree of coverage G is maintained at a defined size, and the distance x between the actuating element B and the sensor slides is varied (as illustrated e.g. in FIG. 2), or
  The distance x is maintained constant, and the degree of coverage G is changed (as illustrated e.g. by the y-displacement in FIG. 3).
  A combination of these two switch mechanisms x and y is also possible (FIG. 3).

Sufficiently known as cost-effective evaluation electronics is an LC oscillating circuit, comprising a sensor inductance L, a fixed capacity C, and an inverting amplifier into the feedback branch of which the LC oscillating circuit is built. The frequency of the oscillating circuit is determined by the resonance frequency of the LC member using the formula:

$$f_r = \frac{1}{2\pi} \times \frac{1}{\sqrt{L \cdot C}}$$

A downstream frequency counter determines the oscillations per unit of time and outputs them as a signal value. For a simple switching function it is sufficient to compare the actual frequency value to a threshold value by means of a comparator and thus to initiate the switching function. In a normal case, the switch signal is set to "1" when the frequency is higher than a set limit frequency, which corresponds to a lower inductance through higher damping. At a lower frequency, the comparator outputs a "0". High powers can then be switched via a downstream high/low switch or a relay R. However, the functions of the frequency counter and comparator can also be realized as so-called firmware in a microcontroller.

Thus a wear-free momentary-contact switch can be realized in a simple manner in an operating unit of the automobile. The damping element is approached by depressing a key to the sensor and is held there by means of a locking mechanism. The lock is not released until the key is depressed again, and the actuator is brought to its rest position at a greater distance from the sensor (ballpoint pen locking principle). Thus keys such as the switches for hazard warning lights, fog lights, rear window defrost, etc., can be realized in a simple and cost-effective manner.

In applications in which very precise switching points are required, the effects of temperature on amplifiers, capacities, comparators, etc., are often problematic. In temperature-stable applications, these effects can be inventively circumvented in that two sensors are applied next to one another on one circuit board and they are simultaneously or alternately switched in (see FIG. 2 or 3). Switching on the inductance L1 or L2 occurs using a switching transistor or field effect transistor or MOSFET (FIG. 2) or an AMUX analog multiplexer (FIG. 3). If a relative evaluation is applied in that the ratio of the first sensor reactance to the second sensor reactance is used as switching criterion, the interfering effects are eliminated. The circuit is very temperature stable.

This type of circuit has also proved to be advantageous in applications in which the position y of the actuator is detected relative to the sensor positions, while the distance x from the actuator to the sensor is kept more or less constant (such as e.g. in displacement and angle sensors). In this case, as well, in accordance with FIG. 3 a relative evaluation takes place that can best occur, but must not exclusively occur, using a microcontroller μC.

Figure 4:
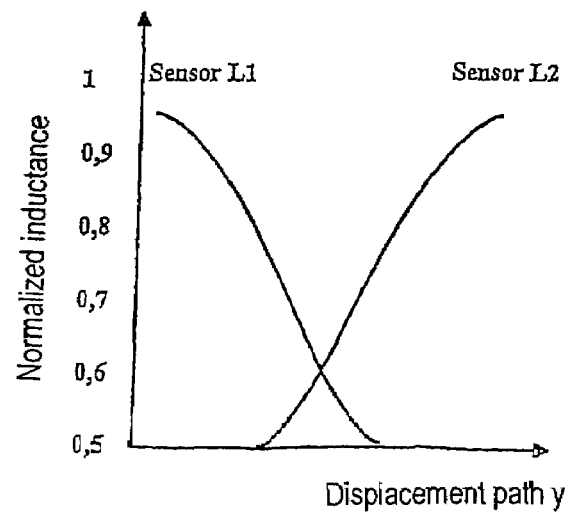
FIG. 4 illustrates a typical characteristic curve for the inductance of a first sensor L1 in accordance with FIG. 3 and a second sensor L2 in accordance with FIG. 3 as a function of the displacement path y.

FIG. 4 illustrates two typical characteristic curves of the normalized inductance as a function of the displacement path y. The microcontroller μC can undertake precise position recognition in the displacement region between the peaks of the characteristic curves L1 and L2. In additional practical applications, even more sensors are used for recognizing the actuator position.

Figure 5:
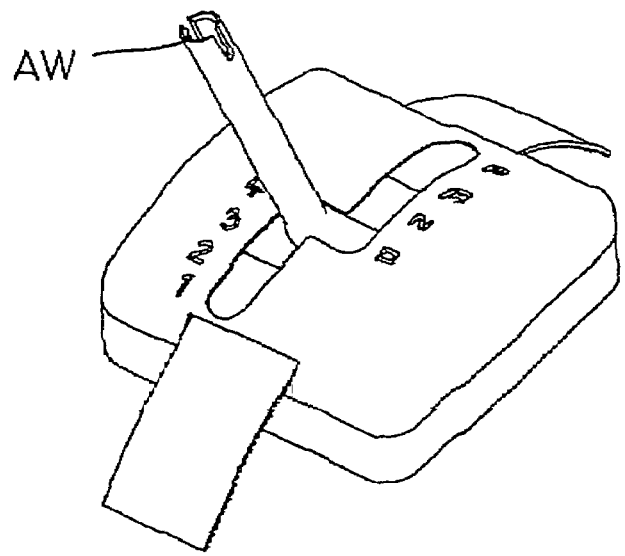
FIG. 5 illustrates a shift gate for a motor vehicle with an automatic gearshift lever that is connected to a switch apparatus in accordance with FIG. 3 or FIG. 6.
Figure 6:
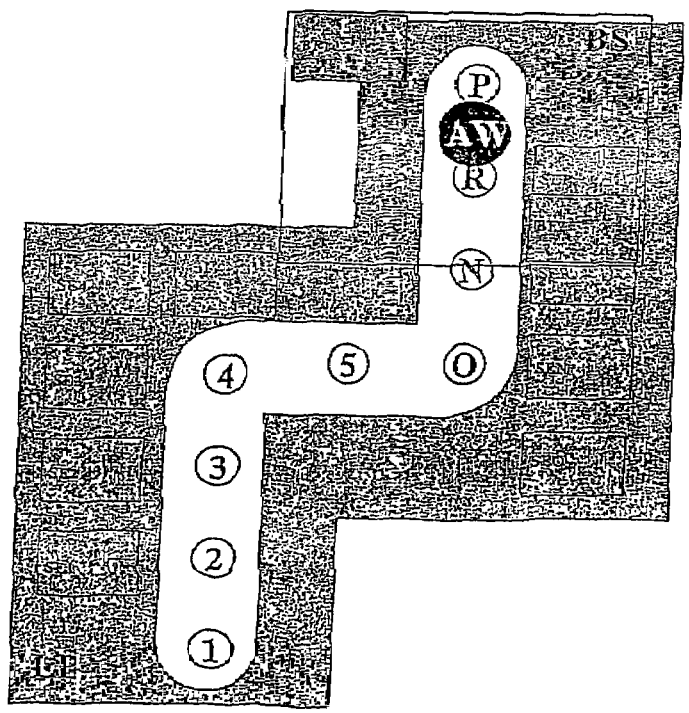
FIG. 6 illustrates the scheme of a printed circuit board with a plurality of sensor units for the shift gate unit in accordance with FIG. 5.

If multiple positions are to be detected in one application event, such as is illustrated in FIG. 5 as a shift gate for a motor vehicle, it is useful to combine a plurality of inductive sensors as a functional unit. Given the example of converting the position recognition of an automatic gearshift lever, this looks as follows:

A printed circuit board as in FIG. 6 is positioned under a cover as in FIG. 5; on its upper side e.g. the backlighting for the cover displays 1, 2, ... P can be mounted. Connected to the automatic gearshift lever AW (see FIGS. 5 and 6), which drops through a break in the printed circuit board, is an actuator slide BS that rests in a planar manner on the bottom side of the printed circuit board LP and to which are affixed one actuator or a plurality of actuators (e.g. the actuator surfaces BF1 and BF2 in FIG. 6). The actuator surfaces are pushed over the various sensor units SE at a defined distance x.

The term displacement means a movement of the actuator slide that can be a straight line or that can change direction. The sensor coils to be passed over can be lined up in a straight line, as is shown in principle in FIG. 7. However, the sensor coils can also be situated adjacent to one another in accordance with a more complex topology, as is used for the shift gate units in accordance with FIGS. 6 and 9.

Figure 7:
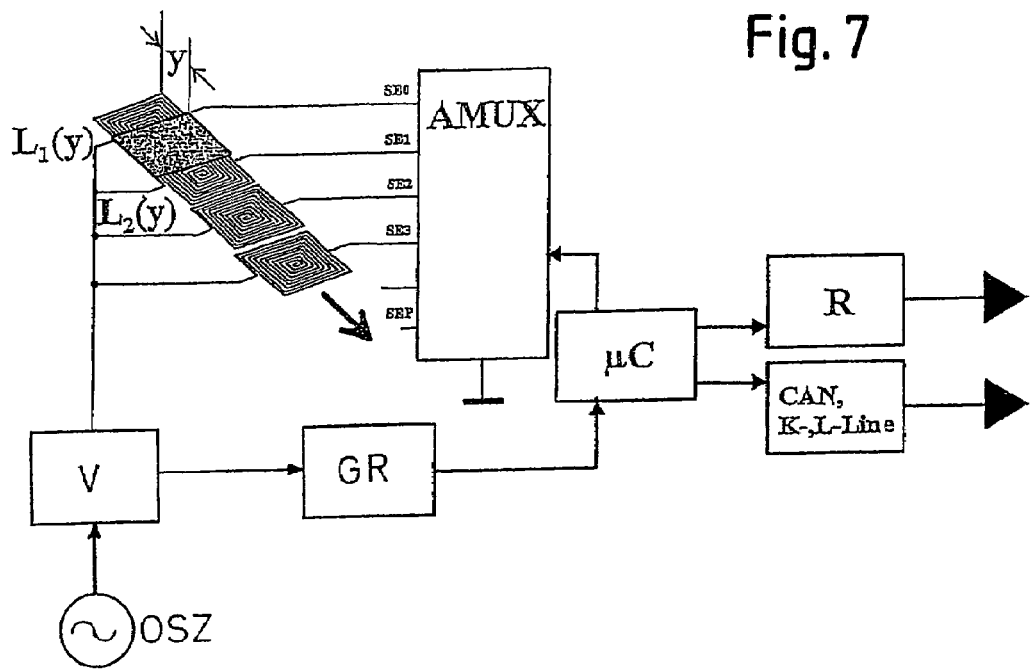
FIG. 7 illustrates the block diagram of an electronic unit when a plurality of inductive sensors are combined.

Furthermore, the topology of the adjacent sensor coils (straight line, polygon, other path) can be situated on a flat or on a curved printed circuit board. FIG. 7 depicts a flat arrangement of sensor coils, while FIGS. 5 and 6 depict an example for a curved printed circuit board that is arranged beneath the curved shift gate. In both cases the actuator slide is displaced at a distance x, which can be largely constant or even variable, above the arrangement of sensor coils.

Another variant of the claimed displacement results when the curved printed circuit board that follows the curved gate in accordance with FIG. 5 is replaced with a flat printed circuit board that is arranged in a plane that runs perpendicular to the surface of the gate. In this case the actuator slide is also positioned vertically and pushed sequentially over the sensor slides that are attached e.g. in arc-shapes to the vertical, flat printed circuit board.

Figure 8:
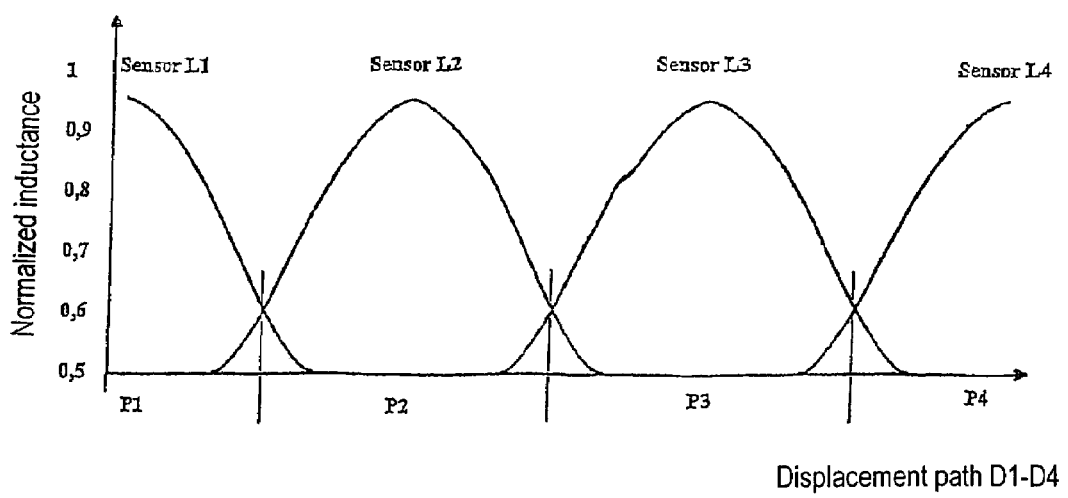
FIG. 8 illustrates the normalized inductances of the sensor signals of the different shifting units in FIG. 7 during shifting events of the automatic gearshift lever from position 1 to position 4.

In the combination of a plurality of inductive switches, the block diagram looks like that in FIG. 7. The associated amplitudes of the sensor signals when the automatic gearshift lever is shifted can be seen in FIG. 8 for the positions 1, 2, 3, and 4, whereby the normalized reactance is applied across the displacement path P1-P4 for the sensors L1-L4. The shifting thresholds P1-P2, P2-P3, and P3-P4 are entered.

Figure 9:
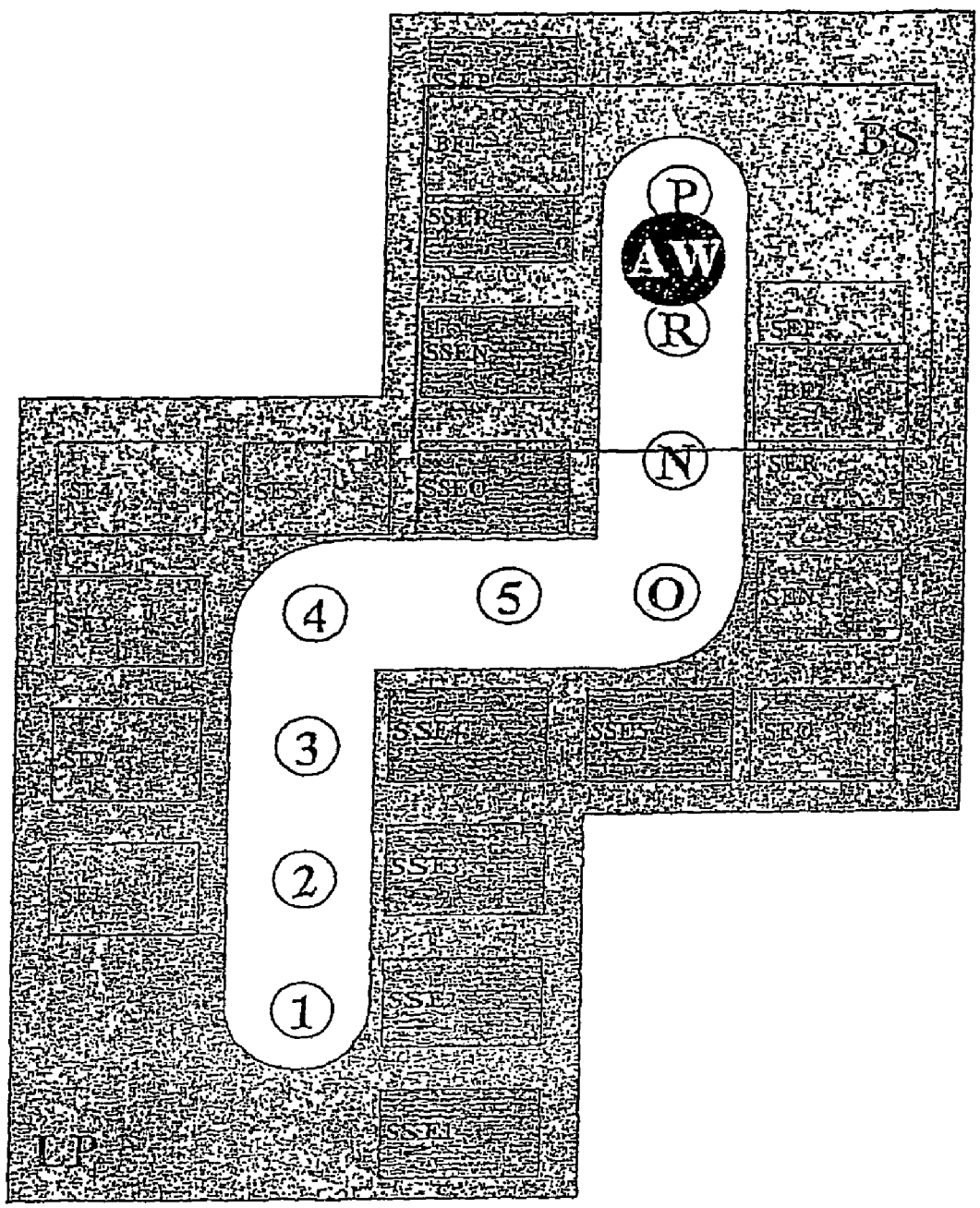
FIG. 9 illustrates a similar scheme of a printed circuit board as in FIG. 6, but with a redundant shifting unit.

Very redundant and therefore certain position recognition can also be realized without major additional complexity as depicted e.g. in FIG. 9. Instead of one sensor unit per position, it is suggested to construct two sensor units per position and to compare the signals. When there are contradictory results, the evaluation unit will perform the switching function so that the entire system is brought into a secure condition. For this, the printed circuit board can be expanded for instance with safety sensor units SSE in accordance with FIG. 9.

The evaluation unit for the sensor module will as a rule be a microcontroller that forwards the switching information to the control electronics or power electronics via an interface (CAN, LIN, etc.).

Figure 10:
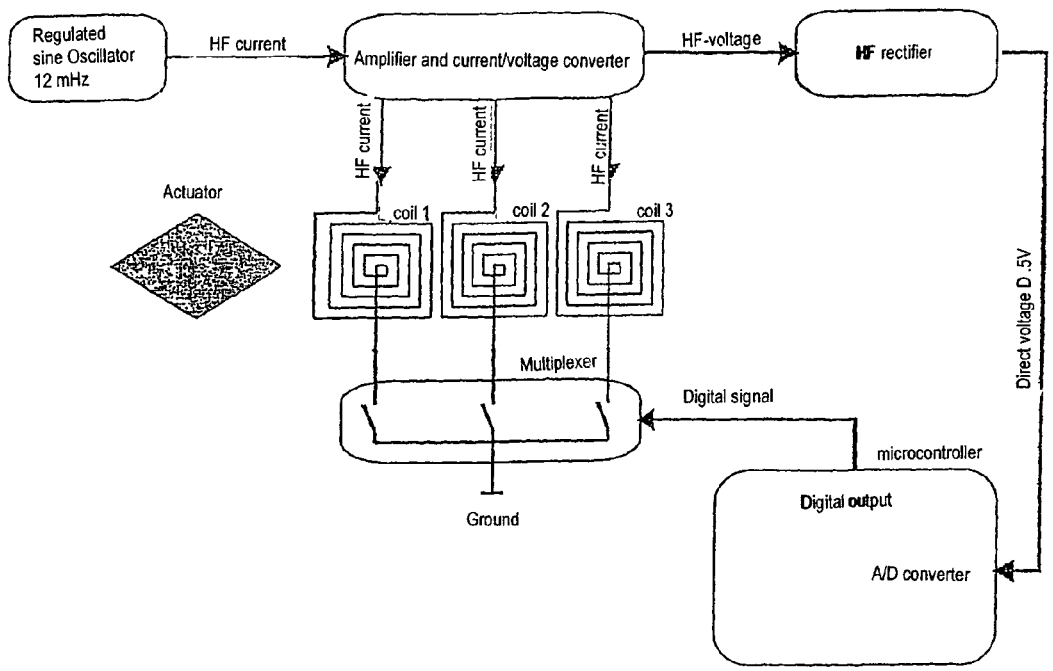
FIG. 10 illustrates the block diagram of an evaluation unit with voltage impression.
Figure 11:
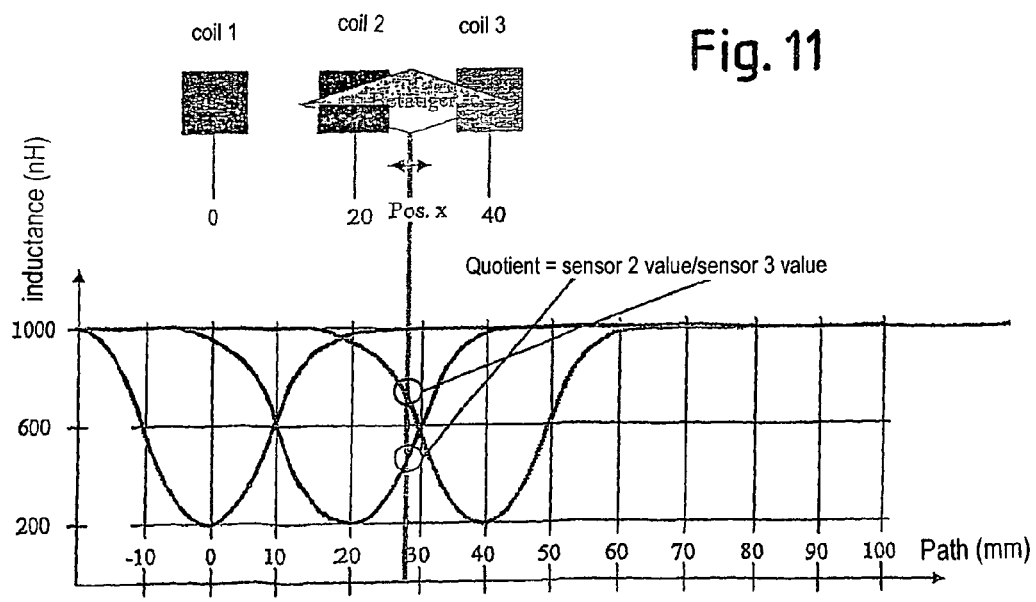
FIG. 11 illustrates the change in inductance evaluated in accordance with FIG. 10.

Signal evaluation occurs for a plurality of sensor coils via a multiplexer (FIG. 3, FIG. 7) that switches on only one of the sensor coils of the evaluation circuit. FIGS. 10 and 11 illustrate one exemplary embodiment of the signal evaluation that can be employed similar to the exemplary embodiment depicted in FIGS. 7 and 8.

In accordance with FIGS. 10 and 11, the limit between the positions of two adjacent sensor coils is determined by a direct comparison of the inductive reactance. In accordance with the circuit diagram in FIG. 10, a sine oscillator generates an alternating voltage of 12 MHz; this is amplified and fed as voltage into one of the three sensor coils that are switched into the time-division multiplex. If the actuator, which comprises conductive metal, is moved over the coils, the inductance of the coils decreases due to eddy current loss. Because of this, the reactance also decreases; it is calculated as follows: $XL = 2*PI*f*L$ (f=12 MHz). If, for example, a coil has inductance of 100 nH without actuator and 200 nH with actuator, the equation above results in XL of 75 Ohms and 15 Ohms, respectively. At constant alternating voltage, a current flows that depends on covering the actuator. This current is transformed into a proportional HF voltage and is fed equalized to the microcontroller.

FIG. 11 depicts the evaluation concept for the microcontroller. The microcontroller measures the equalized voltage of each sensor cyclically in fixed time slots of e.g. 2 ms. If the actuator is moved in fixed path increments over the sensors and the voltages are recorded, the result is curves like those illustrated in FIG. 11. The path region can be enlarged with additional sensors. When the actuator is in the static condition, only two values are evaluated, i.e. there are only two adjacent measurement values for the microcontroller at any point in time. The quotient of two adjacent sensor voltages is calculated in the evaluation firmware in the microcontroller and compared to a fixed value. One or the other switch position is determined depending on whether the quotient is larger or smaller than the fixed value.

Figure 12:
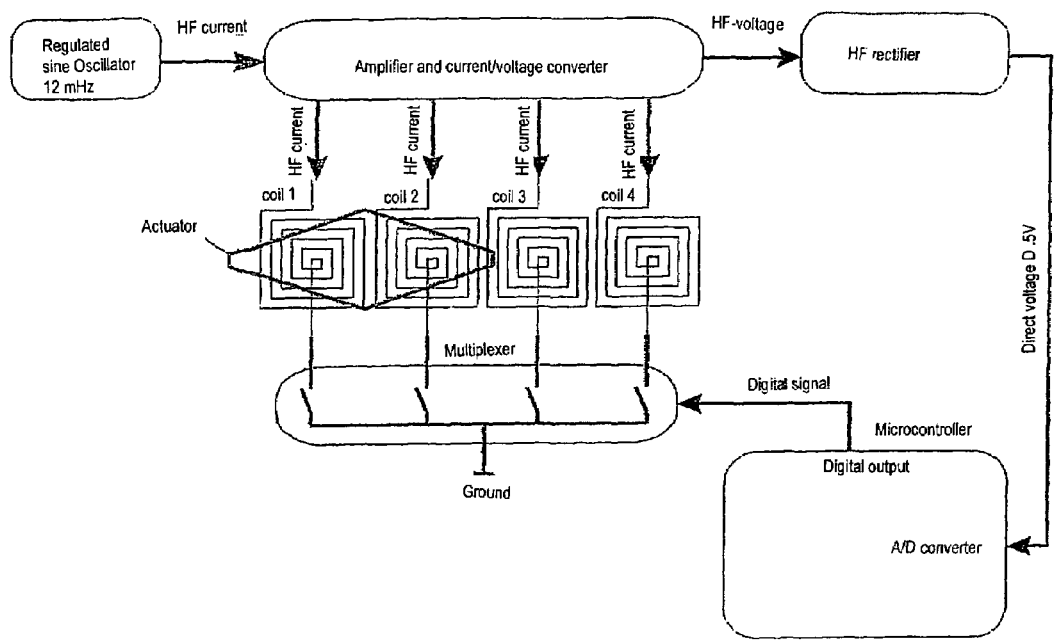
FIG. 12 illustrates the circuit diagram of an evaluation unit with current injection.

As an alternative to the voltage feed in accordance with FIG. 10, FIG. 12 depicts a current feed into the coil reactances. A sine oscillator produces an alternating current with a constant amplitude and constant frequency of for instance f=12 MHz. This alternating current is amplified and fed in sequence into each of the for instance four sensor coils L1 through L4.

If the actuator, which comprises a material that conducts well (for instance copper or brass) is moved over the coils, the inductance L of the coils decreases due to the eddy current losses. Because of this, the inductive resistance XL also decreases; it is calculated as follows: $XL = 2*PI*F*L$. If the actuator does not cover a coil, it has inductance of for instance 1000 nH. On the other hand, if the actuator completely covers a coil, it has inductance of for instance 200 nH. Given the equation above, then, inductive resistance XL is for instance 75 Ohms and 15 Ohms, respectively.

The drop in voltage at one of the coils L1 through L4 is equalized and fed to a microcontroller for further processing. The coils therefore act as sensors for the geometric site of the actuator.

Figure 13:
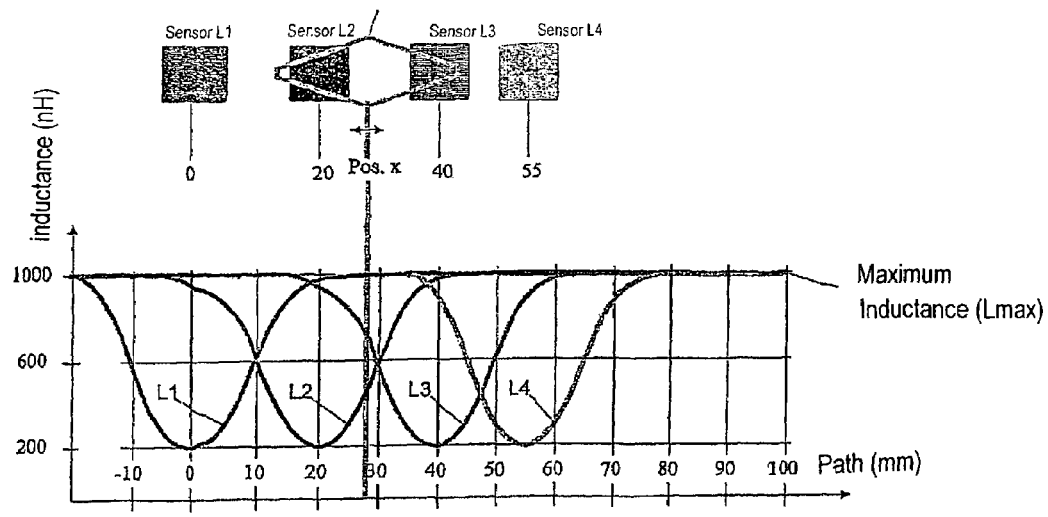
FIG. 13 illustrates the change in inductance evaluated in accordance with FIG. 12.

FIG. 13 illustrates further signal evaluation. The microcontroller measures the voltages of the sensors L1 through L4, which are proportional to their inductances, cyclically in fixed time slots. If a diamond-shaped actuator is moved in fixed path increments over the sensors and the voltages are recorded, the result is nearly sinusoidal curves like those illustrated in FIG. 13. The path region can be enlarged with additional sensors.

Figure 14:
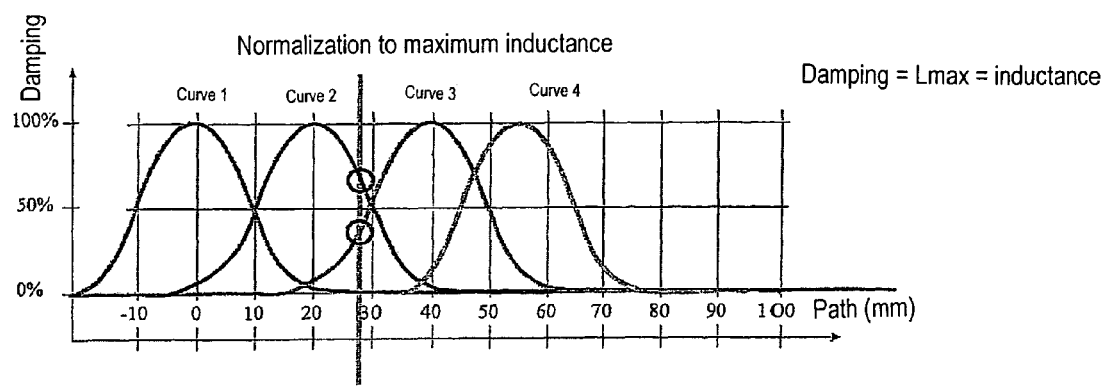
FIG. 14 illustrates a null normalization of the inductance measured in accordance with FIG. 13.

In the next processing step, in accordance with FIG. 14a null normalization is performed. First, the sensor number and the sensor signal with the highest inductance Lmax, 1000 nH in the example, is determined from the curves in accordance with FIG. 13. Then the sensor values are subtracted from Lmax and the four damping curves in FIG. 14 are obtained.

The damping is 0% if one sensor is not covered by the actuator; it is 100% it the sensor is completely covered.

Figure 15:
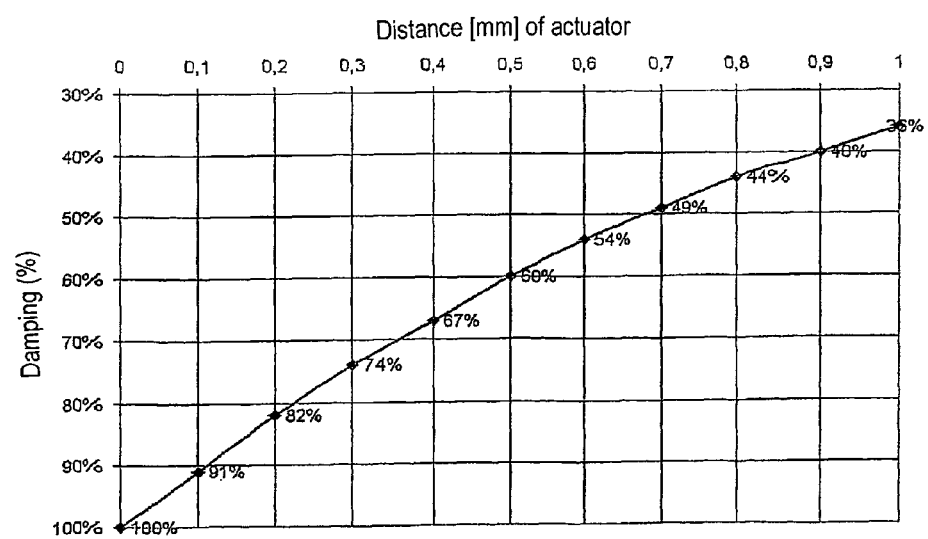
FIG. 15 illustrates a dependence of the null normalization in accordance with FIG. 14 when in addition the distance x in accordance with FIG. 3 changes.

However, the damping is also a function of the distance from the actuator to the sensor coils. The maximum damping decreases as the distance increases, as can be seen in FIG. 15.

Figure 16:
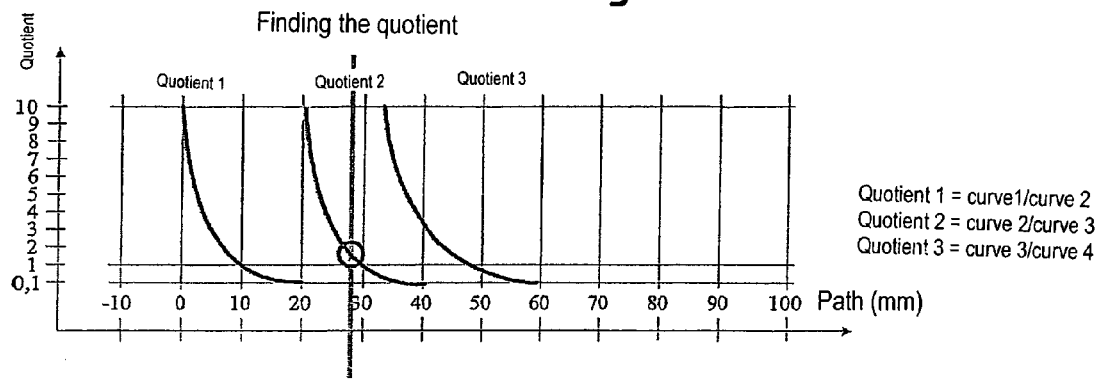
FIG. 16 illustrates finding of quotients in order to become independent of the distance in accordance with FIG. 15.

In order to be unaffected by this change in distance (in some position switch apparatus for automatic transmissions it is not possible to avoid changes in distance), the quotients are found for two adjacent curves are found. From this are obtained for instance the three quotient curves illustrated in FIG. 16.

Figure 17:
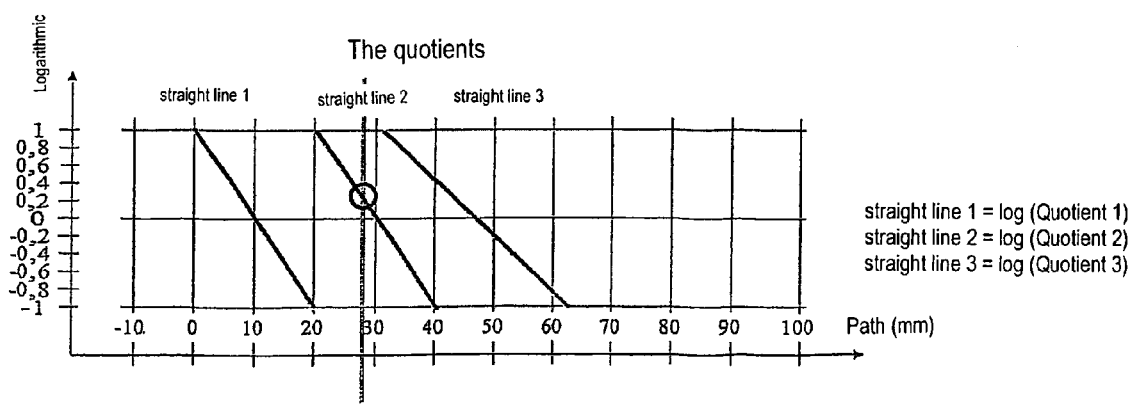
FIG. 17 illustrates a logarithmic evaluation of the quotients in accordance with FIG. 16 for determining the precise path position y.

In order to attain a linear context between path and signal, the quotient curves are then logarithmized (FIG. 17). The more sinusoidal the shape of the curve shapes in FIG. 14, the more linear the logarithmized curves in accordance with FIG. 17.

Starting with each logarithm value, the precise path position y can be determined using the slope and a point on each line (FIG. 17).

Figure 18:
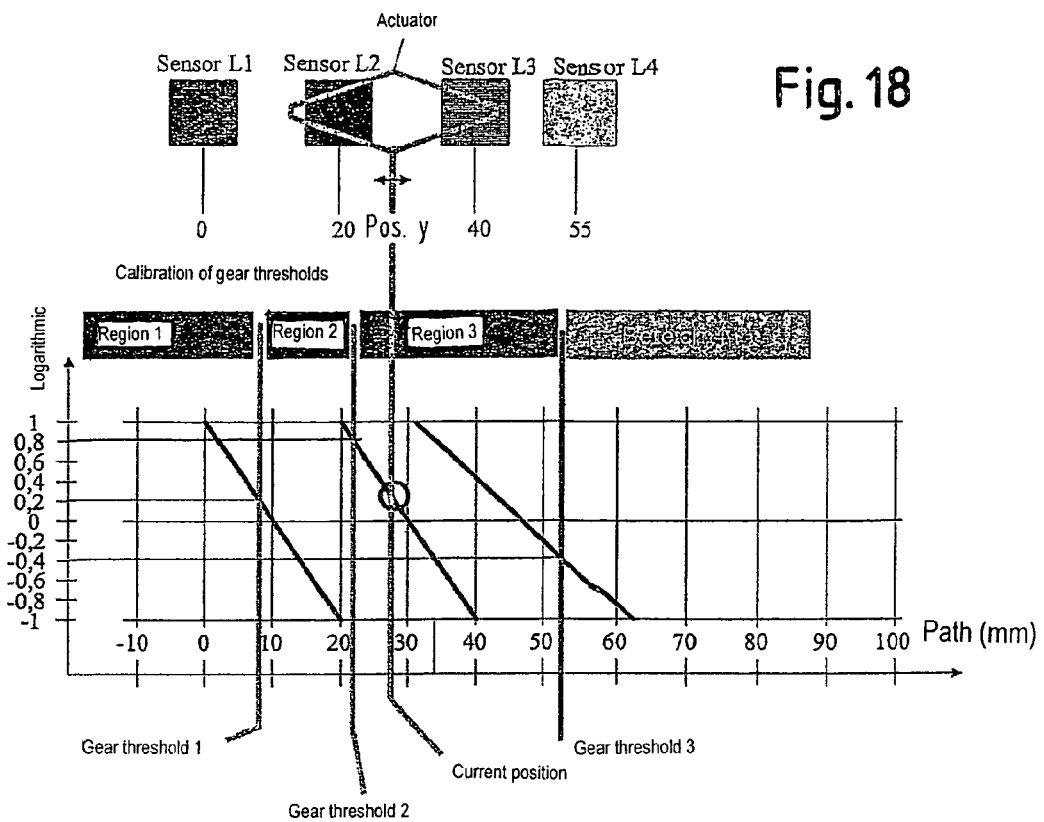
FIG. 18 illustrates a definition of gear thresholds during y-displacements in accordance with FIGS. 12 through 17.

FIG. 18 illustrates the setting of gear thresholds. Automatic transmissions in automobiles have four gear positions (regions): park, reverse, neutral, and drive. When using the sensor system, therefore, a distinction must be made between four regions. There are three gear thresholds between the four regions. Each gear threshold can be set in that the ordinate values for all of the straight lines in accordance with FIG. 17 at certain path positions are stored. These gear thresholds are set as follows:

The actuator is brought to the first position (e.g. 8 mm); now the value on the first straight line is stored (e.g. 0.2). Precisely the same thing is done for the other gear thresholds. During operation, the ordinate value on the currently intersected straight line is continuously compared to the gear thresholds. In the example in FIG. 18, the current position of the actuator is at 28 mm. The value on the ordinate 0.2 here is smaller than the ordinate value of the second gear threshold (0.8). This means that the current position of the actuator is in region 3.

Figure 19:
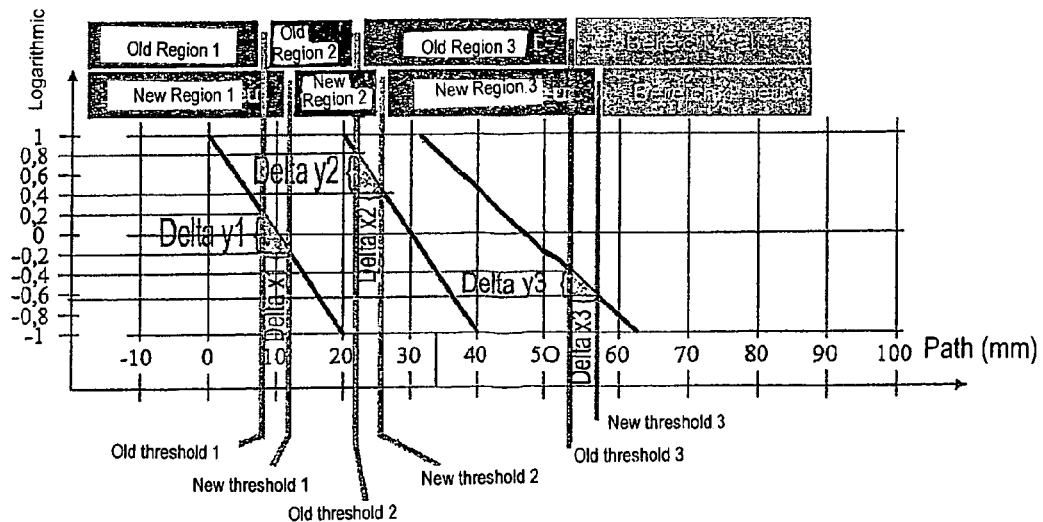
FIG. 19 illustrates a displacement of the gear thresholds in accordance with FIG. 18.

Finally, FIG. 19 illustrates displacement of all gear thresholds to one single position. In practice, it can happen that the complete sensor structure is mechanically displaced with the gear thresholds that have already been set. Then all of the gear thresholds would theoretically have to be re-set in accordance with FIG. 18.

Using a "1-point calibration" it is preferably possible to displace all switch points by the same value at one single position. For this, the slopes of all straight lines in accordance with FIG. 17 and FIG. 18 must be known. In the example in FIG. 19, the gear thresholds are to be displaced from "old" to "new". For this, the actuator is moved to the "New gear threshold" position. Using the difference Δ Y1 of the two points on the ordinates (P1=0.2 and P2=−0.2) and using the slope in the first straight line, the path difference ΔX1 can be calculated. The ordinate values of the new gear thresholds can be calculated for the other straight lines using this information. The new ordinate values are now stored in a non-volatile memory and are used as gear thresholds from now on.

The invention claimed is:

1. An inductive switch apparatus, comprising:
    a sensor unit, the sensor unit comprising:
        a printed circuit board,
        at least first and second sensor coils printed on the printed circuit board in planar configurations and configured to circumscribe areas so as to not overlap each other or circumscribed areas of other coils in a direction normal to planes of said first and second sensor coils, said first and second sensor coils respectively having first and second self-inductances, and
        at least one conductive actuator element configured and mounted so as to be adjustably superimposable to different extents over the first and second sensor coils such that a change in said superimposition extent produces changes in said first and second self-inductances, and
    an evaluation circuit to independently drive said at least first and second sensor coils with first and second signals conductively applied to said first and second coils and indicative of said first and second self-inductances, and said evaluation circuit having a switching function triggered by inductance changes of said first and second self-inductances relative to each other as determined by evaluating said first and second signals as they are conductively applied to said first and second coils.

2. The inductive switch apparatus according to claim 1, wherein the evaluation circuit comprises means for impressing onto said first and second sensor coils said first and second signals as an alternating voltage of constant amplitude and constant frequency such that current levels of said first and second signals are indicative of said first and second self-inductances and are evaluated by said evaluation circuit to detect said first and second self-inductances.

3. The inductive switch apparatus according to claim 1, wherein the evaluation circuit comprises means for impressing onto said first and second sensor coils said first and second signals as an alternating current of constant amplitude and constant frequency such that voltage levels of said first and second signals are indicative of said first and second self-inductances and are evaluated by said evaluation circuit to detect said first and second self-inductances.

4. A position switch apparatus for a vehicle automatic transmission including a plurality of gear speeds, comprising:
    the inductive switch apparatus according to claim 1, and
    a slidable switch for mounting said conductive actuator element such that said conductive actuator element is movable to effect said adjustable superimposition.

5. The position switch apparatus according to claim 4, wherein the slidable switch comprises a substantially horizontally slidable slide, and the conductive actuator element is carried by the slide.

6. The position switch apparatus of claim 4, further comprising means for storing a logarithmic representation of ratios of magnitudes of said first and second signals corresponding to representing an extent of superimposition and for storing a threshold value representing a transition between adjacent gear speeds.

7. The inductive switch apparatus according to claim 6, wherein said logarithmic representation is represented as straight lines on a hypothetical graph versus extent of superimposition and a plurality of said thresholds are simultaneously settable using 1-point calibration.

8. The inductive switch apparatus according to claim 1, wherein said sensor coils are driven by said evaluation circuit only one at a time.

9. The inductive switch apparatus according to claim 1, further comprising a multiplexer, wherein said first and second signals are communicated via the multiplexer to said evaluation circuit.

10. The inductive switch apparatus according to claim 1, further comprising a MOFSET switch, wherein said signal evaluation occurs via the MOFSET switch.

11. The inductive switch apparatus according to claim 1, wherein said evaluation circuit determines a quotient based on a ratio of said first and second signals and executes said switching function based on comparing said quotient with a predetermined value.

12. The inductive switch apparatus according to claim 11, wherein said evaluation circuit determines a logarithmic value of said quotient and compares said quotient with said predetermined value using said logarithmic value.

13. The inductive switch apparatus according to claim 12, wherein the evaluation circuit comprises means for impressing onto said first and second sensor coils said first and second signals as an alternating voltage of constant amplitude and constant frequency such that current levels of said first and second signals are indicative of said first and second self-inductances and are evaluated by said evaluation circuit to detect said first and second self-inductances.

14. The inductive switch apparatus according to claim 13, wherein said first and second coils each have a size of about 10 mm by 10 mm and an inductance of about 1 μH.

15. The inductive switch apparatus according to claim 12, wherein the evaluation circuit comprises means for impressing onto said first and second sensor coils said first and second signals as an alternating current of constant amplitude and constant frequency such that voltage levels of said first and second signals are indicative of said first and second self-inductances and are evaluated by said evaluation circuit to detect said first and second self-inductances.

16. The inductive switch apparatus according to claim 15, wherein said first and second coils each have a size of about 10 mm by 10 mm and an inductance of about 1 μH.

\* \* \* \* \*